(12) United States Patent
Tsang

(10) Patent No.: US 7,340,665 B2
(45) Date of Patent: Mar. 4, 2008

(54) SHARED REDUNDANCY IN ERROR CORRECTING CODE

(75) Inventor: Kinhing P. Tsang, Plymouth, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 427 days.

(21) Appl. No.: 11/168,001

(22) Filed: Jun. 28, 2005

(65) Prior Publication Data

US 2007/0011563 A1    Jan. 11, 2007

(51) Int. Cl.
*G11C 29/00* (2006.01)
(52) U.S. Cl. .................. 714/766; 714/776
(58) Field of Classification Search ........... 714/766, 714/774
See application file for complete search history.

(56) References Cited

U.S. PATENT DOCUMENTS

| | | | | |
|---|---|---|---|---|
| 4,862,462 | A * | 8/1989 | Zulian | 714/758 |
| 5,452,429 | A * | 9/1995 | Fuoco et al. | 714/6 |
| 5,490,155 | A * | 2/1996 | Abdoo et al. | 714/763 |
| 5,537,425 | A * | 7/1996 | Tsou | 714/805 |
| 5,555,250 | A * | 9/1996 | Walker et al. | 714/763 |
| 5,612,965 | A * | 3/1997 | Michaelson | 714/800 |
| 5,666,371 | A * | 9/1997 | Purdham | 714/763 |
| 5,784,393 | A * | 7/1998 | Byers et al. | 714/800 |
| 6,301,152 | B1 * | 10/2001 | Campardo et al. | 365/185.09 |
| 6,724,670 | B2 * | 4/2004 | Jones et al. | 365/200 |
| 6,748,488 | B2 * | 6/2004 | Byrd et al. | 711/114 |
| 6,799,291 | B1 * | 9/2004 | Kilmer et al. | 714/722 |
| 2003/0007487 | A1 * | 1/2003 | Sindhushayana et al. | 370/390 |

OTHER PUBLICATIONS

Takai et al., A 250-Mb/s/pin, 1Gb Double Data Rate SRAM with a Bidirectional Delay and an Interbank Shared Redundancy Scheme, IEEE, vol. 35, No. 2, Feb. 2000.*
Oliver Collins, "Exploiting the Cannibalistic Traits of Reed-Solomon Codes", IEEE Transactions on Comm., vol. 43, No. 11, Nov. 1995, pp. 2696-2703.

* cited by examiner

*Primary Examiner*—Mujtaba K. Chaudry
(74) *Attorney, Agent, or Firm*—Westman, Champlin & Kelly

(57) ABSTRACT

A method and apparatus are provided for storing data. The method and apparatus generate a plurality of ECC codewords, which define a cooperative block. Each ECC codeword includes a plurality of information symbols and first and second sets of corresponding redundancy symbols. Shared redundancy symbols are generated for the cooperative block based on a combination of the second sets of redundancy symbols from the plurality of ECC codewords. A respective set of parity codewords is generated for the cooperative block based on the shared redundancy symbols. The second set of redundancy symbols for each ECC codeword in the cooperative block is derivable from the parity codewords. The cooperative block and the respective parity codewords are stored, without the second set of redundancy symbols, on a storage medium.

20 Claims, 4 Drawing Sheets

SHARED REDUNDANCY IN ERROR CORRECTING CODE

FIELD OF THE INVENTION

The present invention relates to communication channels and more particularly to the use of error correcting codes (ECCs) in the transmission and/or storage of data.

BACKGROUND OF THE INVENTION

In communication channels, data must be transmitted through the channel reliably. Data is represented as a sequence of bits, with each bit taking a value of zero or one. In a data storage device, the channel includes a storage medium on which the data is written and then read back. The data is written to the storage medium through a write channel and is read from the storage medium through a read channel.

One method of increasing the reliability of the data transmitted through a communication channel is to use an error correcting code (ECC). A simple ECC code is based on parity. A parity bit is added to a group of data bits, such as a data word, and has a logic state that is selected to make the total number of ones (or zeros) in the data word either even or odd. The original data word is then transmitted through the channel along with the additional parity bit as a modified data word. The modified data word is received from the channel and an ECC decoder checks the parity of the word against an expected value. If the parity is correct, the ECC detector assumes there are no bit errors. If the parity is incorrect, the ECC detection circuit assumes there is an error in the transmitted data.

More complex ECC codes have also been used for enabling not only detection of additional errors but also correction of some of the detected errors. For example, a single-error correction, double-error detection (SEC-DED) Hamming code adds enough additional parity bits to enable the detection circuit to detect and correct any single-bit error in a data word and detect two-bit errors. A Reed Solomon ECC Code corrects symbols (groups of bits) not bits. Reed Solomon Error Correcting Codes are often used in data storage systems, such as in disc drives. The main purpose of the ECC is to correct any errors occurring during the read back of data from the storage medium. In a disc drive, user data is formatted into sectors. Each sector typically includes 512 bytes of user data. The data of each sector is encoded into an ECC codeword. Each codeword contains the user data and the redundancy (parity symbols) generated by the encoder. The correction capability of each code is determined by the quantity of redundancy. With more redundancy, more error can be corrected. However, more redundancy reduces the area at which the user data can be stored on the storage medium. Also, severe errors usually are not evenly distributed over data sectors. Therefore, distributing redundancy uniformly in all sectors may not be an effective use of added redundancy. A standard sector-based ECC provides an equal number of redundant symbols for equal protection in each sector. But typically very few sectors make use of the full correction capability. Since extremely severe errors are not likely to occur frequently, many of the redundant symbols will not be utilized but will still take up storage space.

Improved encoding techniques are therefore desired for increasing correction capability of an ECC code while limiting the storage area consumed by the code. Embodiments of the present invention provide solutions to these and other problems and offer other advantages over the prior art.

SUMMARY OF THE INVENTION

One embodiment of the present invention is directed to a method of storing data. The method includes: (a) generating a plurality of ECC codewords, which define a cooperative block, each ECC codeword comprising a plurality of information symbols and first and second sets of corresponding redundancy symbols; (b) generating shared redundancy symbols for the cooperative block based on a combination of the second sets of redundancy symbols from the plurality of ECC codewords; (c) forming a set of respective parity codewords for the cooperative block based on the shared redundancy symbols, wherein the second set of redundancy symbols for each ECC codeword in the cooperative block is derivable from the parity codewords; and (d) storing the cooperative block and the respective parity codewords, without the second set of redundancy symbols, on a storage medium.

Another embodiment of the present invention is directed to a data storage device. The data storage device includes a write channel and at least one data storage medium. The write channel is adapted to: (a) generate a plurality of ECC codewords, which define a cooperative block, each ECC codeword comprising a plurality of information symbols and first and second sets of corresponding redundancy symbols; (b) generate shared redundancy symbols for the cooperative block based on a combination of the second sets of redundancy symbols from the plurality of ECC codewords; (c) form a set of respective parity codewords for the cooperative block based on the shared redundancy symbols, wherein the second set of redundancy symbols for each ECC codeword in the cooperative block is derivable from the parity codewords; and (d) store the cooperative block and the respective parity codewords, without the second set of redundancy symbols, on the at least one data storage medium.

Another embodiment of the present invention is directed to a data storage medium. The data storage medium includes a user data area and a cache area, separate from the user data area. The user data area includes a plurality of data sectors. The data sectors are grouped in cooperative blocks. Each cooperative block includes a set of the data sectors and a respective parity sector. Each data sector includes a plurality of information symbols and a first set of redundancy symbols. The parity sector includes shared redundancy symbols from which a second set of hidden redundancy symbols, not stored in the user data area, can be recreated for each of the data sectors in the cooperative block. The cache area stores an updated data sector for a corresponding one of the cooperative blocks. The updated data sector includes updated information symbols, an updated first set of redundancy symbols, and an updated second set of hidden redundancy symbols for the updated data sector.

Other features and benefits that characterize embodiments of the present invention will be apparent upon reading the following detailed description and review of the associated drawings.

DETAILED DESCRIPTION OF ILLUSTRATIVE EMBODIMENTS

An embodiment of the present invention uses a "redundancy sharing" concept to improve error correction capability of an error correcting code (ECC) for a data storage device, such as a disc drive. The redundancy sharing concept allows some of the redundant symbols generated by the ECC code to be shared among a group of sectors of data. This provides the capability to correct a few sectors with very severe error bursts using substantially less redundant symbols than a typical ECC. As described in more detail below, the redundancy sharing concept uses two modes of correction. The first mode corrects each sector "on-the-fly" as is typical for a normal ECC. The second mode of correction is invoked when a severe error occurs, and it is considered a recovery mode.

Embodiments of the present invention can be used in any communication channel. Although an embodiment of the present invention is described below in the context of a data storage system, alternative embodiments can be implemented in non-data storage applications. The term "data storage system" can include any system in which data is written to a storage medium and then read back from the storage medium. The storage medium can include mediums such as magnetic hard discs, floppy discs, magnetic tapes, optical discs, an integrated circuit memory, for example.

Figure 1:
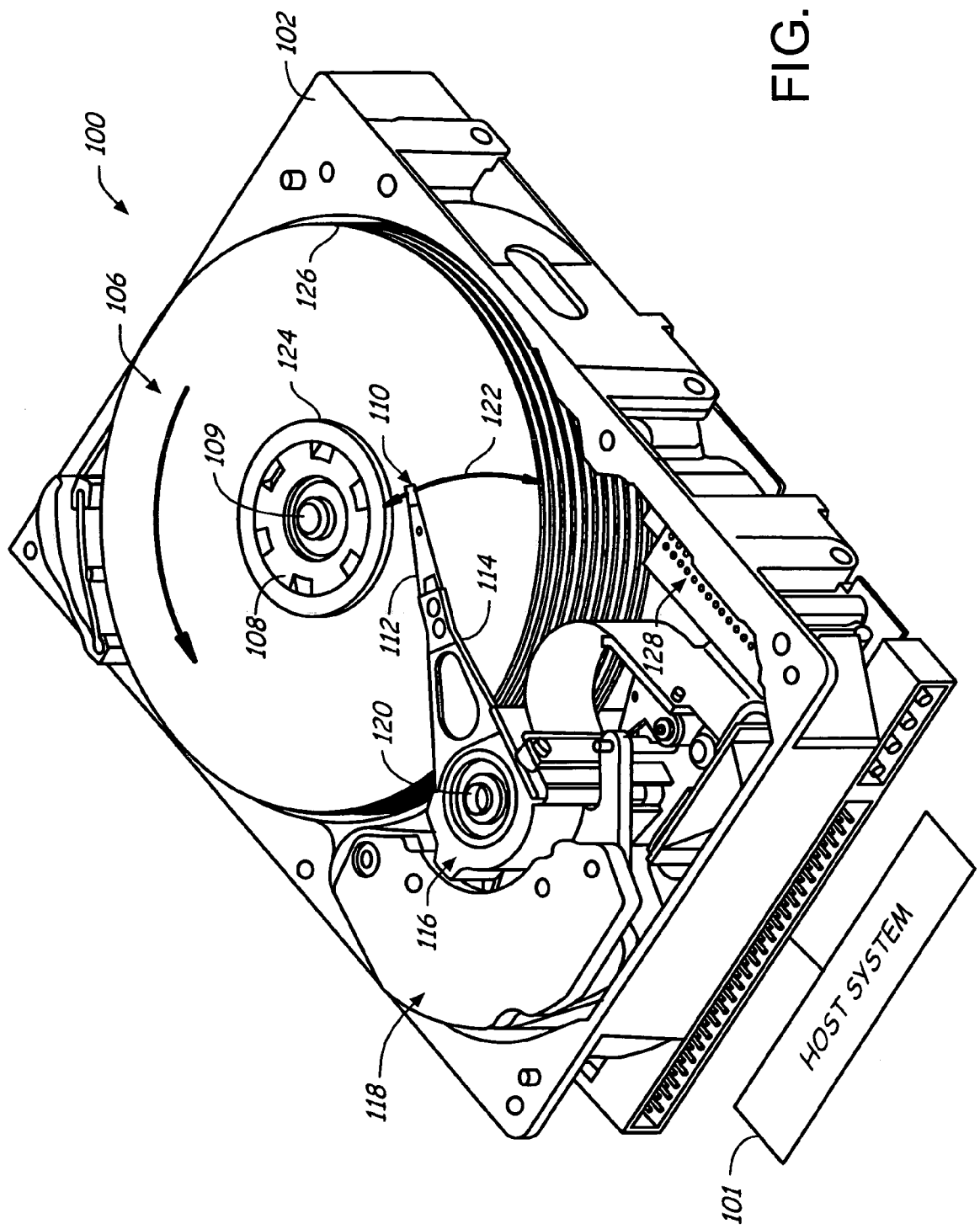
FIG. 1 is a perspective view of a disc drive 100 in which an embodiment of the present invention is useful.

FIG. 1 is a perspective view of a disc drive 100 in which an embodiment of the present invention is useful. Disc drive 100 forms part of a communication channel in which disc drive 100 communicates with a host system 101 and includes a housing with a base 102 and a top cover (not shown). Disc drive 100 further includes a disc pack 106, which is mounted on a spindle motor (not shown), by a disc clamp 108. Disc pack 106 includes a plurality of individual discs, which are mounted for co-rotation about a central axis 109. Each disc surface has an associated read/write head, which is mounted to disc drive 100 for communicating with the disc surface. In the example shown in FIG. 1, head 110 are supported by suspensions 112, which are in turn attached to track accessing arms 114 of an actuator 116. The actuator shown in FIG. 1 is known as a rotary moving coil accuator and includes a voice coil motor shown generally at 118. Voice coil motor 118 rotates actuator 116 with its attached heads 110 about a pivot shaft 120 to position heads 110 over a desired data track along an arcuate path 122 between a disc inner diameter 124 and a disc outer diameter 126. Voice coil motor 118 operates under control of internal (or external) circuitry 128.

The heads 110 and rotating disc pack 106 define a communication channel that can receive digital data and reproduce the digital data at a later time. In one embodiment, an encoder within internal circuitry 128 receives user data, typically from a digital computer, and then encodes the data into successive codewords according to a code. The encoded data is then used to modulate a write current provided to a write transducer in the head 110. The write traducer causes the modulated codeword to be encoded on one or more magnetic layers in disc pack 106. At a later time, a read transducer in the head 110 recovers the successively modulated codewords from the magnetic layer as a serial modulated read signal. Read circuitry within internal circuitry 128 demodulates the read signal into successive parallel codewords. The demodulated codewords are then decoded by a decoder within circuitry 128, which recovers the original user data for use by host 101.

A variety of different encoding techniques have been used to encode user data before the data is transmitted through a communication channel. One common technique is the use of ECC codes, which are often used in conjunction with one or more additional encoding techniques, such as block codes and convolution (tree) codes, etc. Some of these codes place constraints on the code words in order to increase the likelihood of detecting the read data correctly, such as by avoiding patterns known to cause read errors. Also, ECC codes can be used with a variety of different types of decoders. One of the more recent decoding techniques is known as "iterative" (or "turbo") decoding, because the data is processed multiple times in the detector. In a typical iterative decoder, special coding (parity and interleaving are two of several options) is introduced before the data is transmitted to the channel. Although the present disclosure is described in the context of ECC codes, it should be understood that such ECC codes can be used in conjunction with one or more additional codes or coding/decoding techniques.

The main purpose of error correcting codes is to correct errors occurring during the read back of data from the recording media, such as the surfaces of the discs in disc pack 106. In a typical disc drive, user data is formatted into sectors, and each sector typically includes 512 bytes of data. However, the term "sector" can refer to any group of data bits having any size and format or arrangement on data storage media or transmitted through a communication channel. The data of each sector is encoded into an ECC codeword. Each ECC codeword contains the user data and additional redundancy symbols (also known as "parity" symbols) generated by an ECC encoder. A standard sector-based ECC code includes K information symbols and $R_1$ parity symbols, where K and $R_1$ are positive integer variables. While the common parity symbol size ranges from 8 bits to 12 bits per ECC symbol, the 10-bit parity symbol size is most popular in today's disc drives. The correction capability of each ECC symbol (or codeword) is equal to half of the parity symbols. For example, if the are $R_1=10$ parity symbols, the code will be able to correct five erroneous information symbols. Errors with known locations are referred to as erasures. If all the error locations are supplied to the ECC decoder by the read channel, the error correction count can be doubled. A codeword with $R_1=10$ parity symbols will be able to correct ten erasure symbols. In general, a codeword with $R_1$ parity symbols can correct T errors and S erasures, where $(2T+S) \leq R_1$.

1. Shared Redundancy

With "shared redundancy", an additional $R_2$ parity symbols are generated for each ECC codeword, and the additional $R_2$ parity symbols are combined among a set of K information symbols (e.g., sectors), which can be referred to as a "cooperative block". The additional $R_2$ parity symbols provide enhanced correction capability for the cooperative block.

Figure 2:
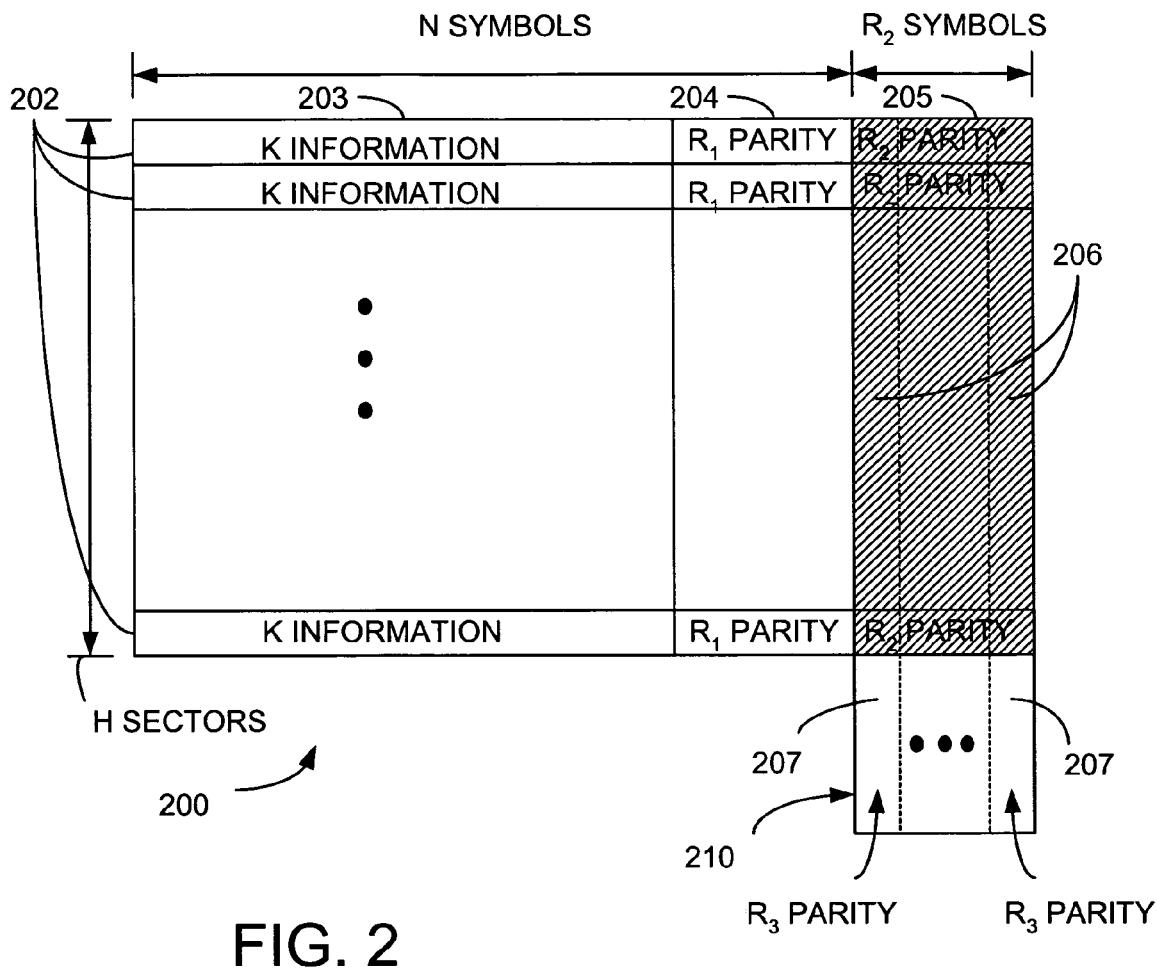
FIG. 2 is a diagram illustrating a cooperative block according to one embodiment of the present invention.

FIG. 2 is a diagram illustrating a cooperative block 200 according to one embodiment of the present invention. Cooperative block 200 includes H sectors 202 arranged horizontally in FIG. 2. Each of the H sectors 202 includes K information symbols 203, $R_1$ parity symbols 204, and $R_2$ parity symbols 205. The $R_1$ and $R_2$ parity symbols are generated as a function of the K information symbols using an ECC code, such as a Reed Solomon code. The $R_1$ and $R_2$ parity symbols can either be generated by a single encoder as one code or by two separate encoders as two different codes. If two different codes are used, $R_2$ is usually much larger than $R_1$.

Unlike a standard ECC, the additional $R_2$ parity symbols are not stored on the storage media (e.g., the disc surface) with the cooperative block 200. The additional $R_2$ parity symbols are referred to as hidden redundancy. These hidden redundancy symbols are used to generate $R_2$ vertical ECC codewords 206. In one embodiment, one of the $R_2$ parity symbols from each of the H sectors is used to form H "information" symbols in each of the vertical codewords 206. The H "information symbols are then used to generate corresponding $R_3$ parity symbols 207. Each set of $R_3$ parity symbols 207 represents redundancy for the corresponding vertical codeword 206. Thus, there are a total of ($R_2*R_3$) shared redundancy symbols. The ($R_2*R_3$) shared redundancy symbols, represented by arrow 210, are stored in a special parity (or redundancy) sector that is appended to the end (or at any other location) of cooperative block 200. This parity sector is considered part of cooperative block 200.

During a read operation, one or more sectors are read from one or more disc surfaces by respective read/write heads 110, shown in FIG. 1, and passed to the read channel of the data storage device. The read channel decodes the read data received from the read/write heads to recover the original user data. During this process, the ECC codes are used to detect and correct errors in the read data. When a sector has been read that has more errors that can be handled by the corresponding $R_1$ parity symbols, the corresponding $R_2$ parity symbols can be reconstructed by reading the entire cooperative block 200. The parity sector appended to the end of the cooperative block can then be used to recreate the vertical codewords 206 containing the $R_2$ parity symbols of each of the H sectors. The horizontal $R_2$ parity symbols 205 for the corresponding sector can then be retrieved from the recreated vertical codewords 206 and used with the $R_1$ parity symbols to correct additional errors.

This reconstruction is possible as long as there are less than $R_3$ sectors that cannot be recovered by only using the $R_1$ parity symbols. In other words, a data storage system utilizing the cooperative block shown in FIG. 2 can correct up to $R_3$ sectors within the H-sector span where each of these sectors contains no more than T error symbols and S erasure symbols, where $(2T+S) \leq R_1+R_2$.

In a standard data sector having a Reed Solomon code with 10 bits per symbol each sector has about 418 user symbols. A designed correction capability of T=20 means there are 2*T=40 additional parity symbols per sector. In this example, the code rate 418/(418+40)=418/458=0.9126.

Comparing this example to the embodiment shown in FIG. 2, if we let H=256 sectors, $R_1$=20, $R_2$=20, $R_3$=10, each sector will be able to correct 10 symbol errors on-the-fly and if necessary, invoke the redundancy sharing mode, which can correct up to 20 symbol errors in 10 sectors out of the 256-sector cooperative block. The collective code rate for this embodiment of the present invention is therefore (256*418)/((256*438)+(20*10))=0.9526. The rate improvement is 0.9526/0.9126=1.0438. This rate improvement is equivalent to an improvement of 4.38% in linear storage density.

The shared redundancy scheme shown in FIG. 2 can be utilized to substantially extend the correction capability for sectors with large defects or long written-in errors. The shared redundancy scheme also works well with iterative-type detectors. Iterative-type detectors provide very good performance when the signal-to-noise ration (SNR) is relatively high but may cause severe errors when encountering a sector with relatively poor SNR. In these circumstances, the shared redundancy mode can be utilized to correct these severe errors.

The values of $R_1$, $R_2$, and $R_3$ may be chosen accordingly so that the ECC capability accommodates the needs of the product parameters. For example, one option is to keep the regular "on-the-fly" ECC correction capability at a relatively moderate value such as T=15 ($R_1$=30) and at the same time add a substantial number of $R_2$ hidden symbols (such as $R_2$=100) to each sector so that very severe errors can be corrected at the expense of a small percentage increase in redundancy. In this case, the $R_1$ and $R_2$ can be treated as two independent Reed Solomon codes. The code with redundancy $R_1$ can be decoded using "on-the-fly" hardware within the read channel. However, the code with the redundancy $R_2$ can be decoded with firmware so the cost of additional hardware can be reduced. However, either of the $R_1$ and $R_2$ redundancy symbols can be decoded using hardware, software or firmware in alternative embodiments of the present invention. The sizes of $R_1$ and $R_2$ can be chosen such that the data storage system only has to invoke the $R_2$ code occasionally so that the performance of the entire system is not impacted significantly.

Figure 3:
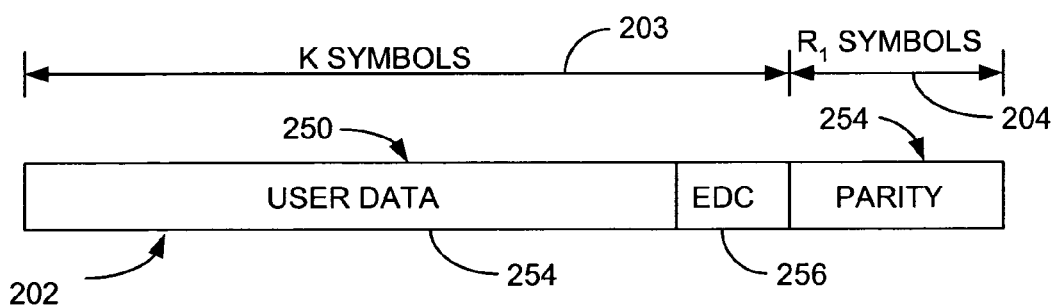
FIG. 3 is a diagram illustrating the format of a data sector in the cooperative block according to one embodiment of the present invention.

FIG. 3 is a diagram illustrating the format of one of the sectors 202 shown in FIG. 2 as it is stored on the storage media. Sector 202 includes an information field 250 and a parity field 252. Information field 250 has K information symbols 203, which are divided into a user data field 254 and an error detecting code (EDC) field 256. In one embodiment, four EDC symbols are generated for each sector 202 of user data. The purpose of the EDC symbols is to detect (not correct) data errors through the use of a corresponding polynomial. Any EDC code can be used, such as a Reed Solomon code. Parity field 252 includes the $R_1$ parity symbols 204. The $R_2$ parity symbols are not stored as part of sector 202.

Figure 4:
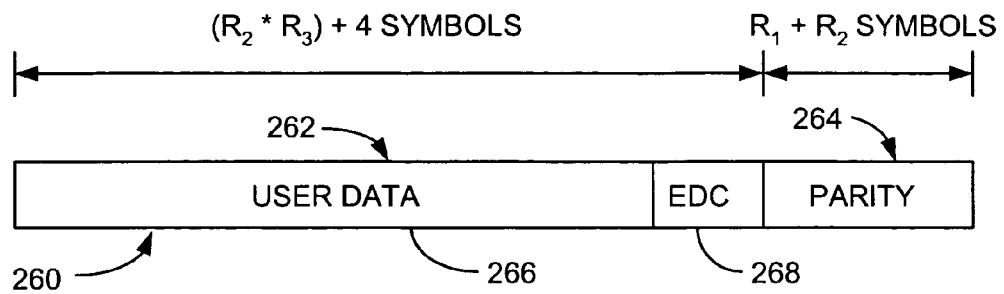
FIG. 4 is a diagram illustrating the format of a parity sector in the cooperative block according to one embodiment of the present invention.

FIG. 4 is a diagram illustrating the format of a parity sector 260 that is generated and stored on the storage media with the cooperative block shown in FIG. 2, according to one embodiment of the present invention. As mentioned above, each horizontal codeword in the cooperative block has K information symbols and ($R_1+R_2$) parity symbols. After generating the $R_3$ parity symbols, all $R_2$ parity symbols of horizontal codewords in the cooperative block are discarded and only the ($R_2*R_3$) shared redundancy symbols 210 of the vertical codewords are stored as a special parity sector as part of the cooperative block.

Referring to FIG. 4, parity sector 260 includes an "information" field 262 and a redundancy or "parity" field 264. Information field 262 includes a data field 266 and an EDC field 268. The $R_3$ vertical word parity symbols 207 (FIG. 2) are concatenated together and treated as data for data field 266. A plurality of EDC symbols are generated for field 268 based on data field 266. In one embodiment, four EDC symbols are generated from the ($R_2*R_3$) vertical parity symbols. In addition, an ECC encoder generates $R_1$ and $R_2$ parity symbols based on the information field 262. These $R_1$ and $R_2$ parity symbols form the parity field 264.

The information field 262 thus contains all the ($R_2 * R_3$) parity symbols of the vertical codewords 206 and the corresponding EDC symbols in field 268. The parity field 264 of the special parity sector is longer than that of a regular data sector since all of the $R_1$ and $R_2$ parity symbols are written to the data storage media. However, the values of $R_2$ and $R_3$ can be chosen such that the total number of symbols in parity sector 260 will be the same as a regular data sector. The resulting parity sector 260 is then written to the storage media as part of the cooperative block.

Other sector formats can be used for the data and parity sectors in alternative embodiments of the present invention.

Figure 5:
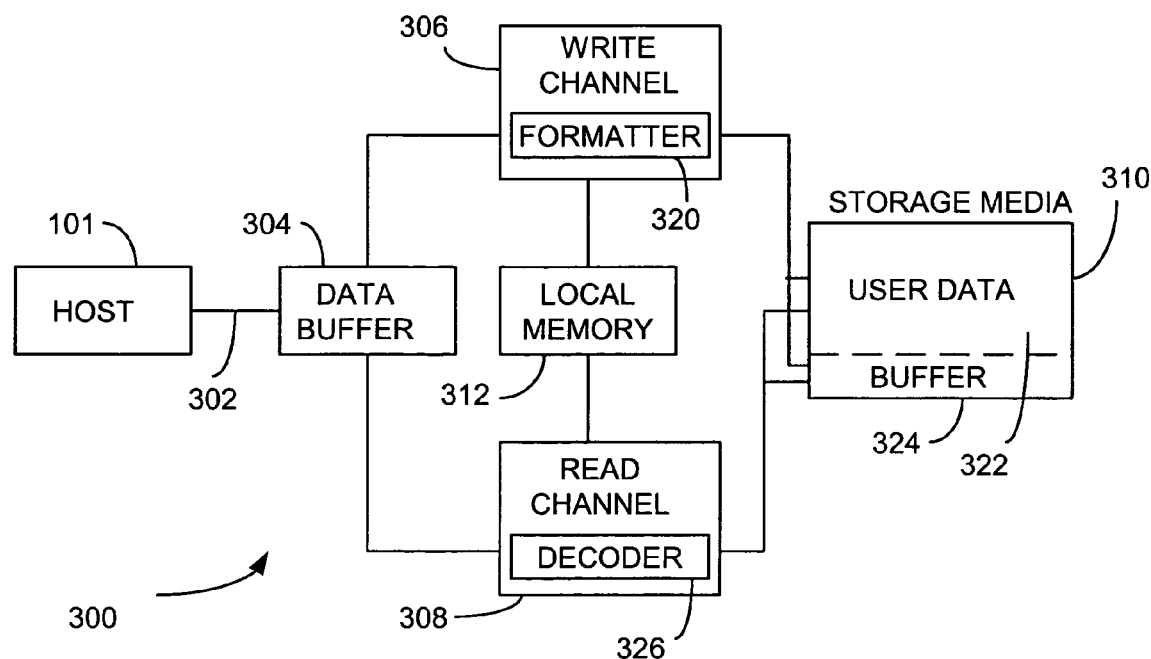
FIG. 5 is a partial block diagram of a data storage device in which shared redundancy can be implemented according to one embodiment of the present invention.

FIG. 5 is a partial block diagram of a data storage device in which shared redundancy can be implemented according to one embodiment of the present invention. Data storage device 300 can include disc drive 100 shown in FIG. 1 or any other type of data storage device. Data storage device 300 includes user data input/output 302, data buffer 304, write channel 306, read channel 308, storage media 310 and local memory 312. User data received from host system 101 that is to be stored on storage medium 310 is passed through data buffer 304 to write channel 306. Write channel 306 includes a data formatter 320 for encoding the data for storage on media 310. For example, data formatter 320 can generate error detection code (EDC) symbols for the user data and the $R_1$, $R_2$ and $R_3$ parity symbols discussed with respect to FIG. 2. Write channel 306 can also include numerous other elements for further encoding the user data and/or otherwise formatting the resulting codewords for writing onto storage media 310, as is know in the art. Formatter 320 uses local memory 312, such as a random access memory, while generating the appropriate parity symbols.

Storage medium 310 includes a user data area 322 and a buffer area 324. User data area 322 represents the majority of storage space within storage medium 310. Buffer area 324 represents a smaller area such as a second-level "L2" cache area that can be used for quickly storing and retrieving data, as may be desired. Data storage device 300 can also include a first-level "L1" cache within local memory 312. In one embodiment, storage media 310 comprises an individual data storage disc or a disc pack such as that shown in FIG. 1.

Read channel 308 detects data read from user data area 322 and/or buffer area 324. Similar to write channel 306, read channel 308 can include numerous elements for detecting the read data and recovering the original user data to be provided to data buffer 304. One of these elements includes an ECC decoder 326 for decoding the ECC codewords generated by data formatter 320.

Figure 6:
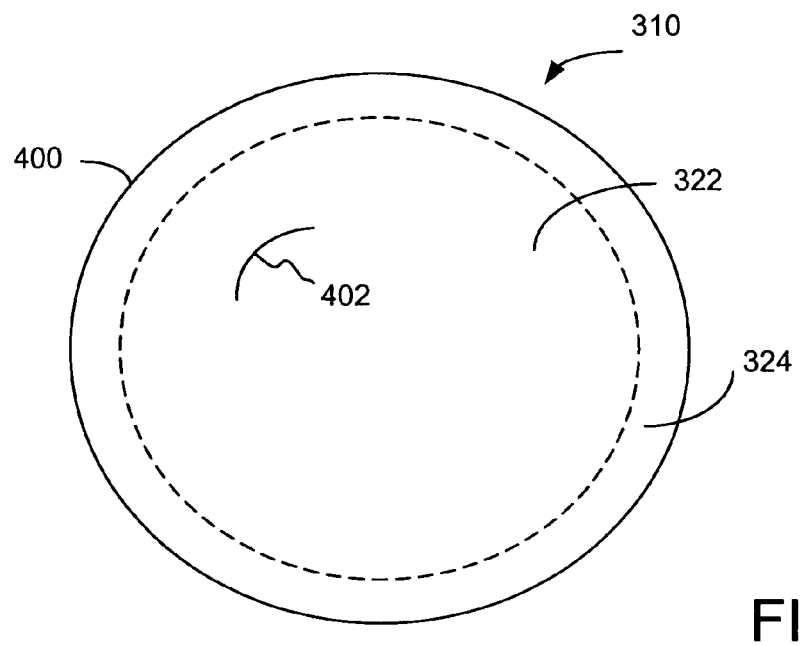
FIG. 6 is a diagram illustrating one of the discs in the disc drive shown in FIG. 1.

FIG. 6 is a diagram illustrating one of the discs 400 in disc pack 106 shown in FIG. 1. Disc 400 has a surface with a user data area 322 and a buffer area 324. Each of the data tracks in user data area 322 is divided into a plurality of sectors such as sector 402 for storing the H sectors 202 shown in FIGS. 2 and 3 and the parity sector 260 shown in FIG. 4 of each cooperative block 200. In this example, some of the outer data tracks on disc 400 are reserved for implementing buffer area 322, which can be used for maintaining an "L2" cache.

2. Write Operations

Referring back to FIG. 5, when data storage device 300 writes a regular data sector, formatter 306 appends the $R_1$ redundant symbols to the user data so the information and the redundant field are written consecutively within user data area 322.

To write a parity sector, there are three modes of operation. The first mode is for use in streaming data from host computer 101. This mode can be used when the entire cooperative block 200 is being written to user data area 322. In this mode, as the write data stream is fetched from data buffer 304, formatter 320 generates the regular $R_1$ parity symbols and the hidden redundancy $R_2$ parity symbols. The regular $R_1$ parity symbols are written to the storage media (e.g., disc) with the corresponding user data as successive data sectors, such as data sector 202 shown in FIG. 3. The hidden redundancy $R_2$ parity symbols are collected in local memory 312. When all the data sectors of a cooperative block are written, the $R_2$ parity symbols stored in local memory 312 are used to generate the vertical codewords 206 (shown in FIG. 2) using the same ECC encoder or a different encoder. After all the $R_2$ vertical codewords 206 for a cooperative block are generated, the $R_2$ parity symbols are discarded and the corresponding $R_3$ parity symbols are used to generate a parity sector 260 (as shown in FIG. 4), which is written to the disc as the last special sector of the cooperative block.

The second mode of operation is used when the data is written to the L2 cache implemented within buffer area 324. In this mode, the write data stream fetched from data buffer 304 is sent to the L2 cache through formatter 320, where all the $R_1+R_2$ parity symbols are generated and written to the disc with the corresponding K information symbols. In this mode, the $R_2$ parity symbols are not yet discard. The second mode of operation can be useful for temporary storing updated sectors, such as when performing read/modify/write operations as discussed below.

The third mode of operation is used when a cooperative block that is stored in user data area 322 is only partially updated. In this mode, a read/modify/write operation is performed on the sector to be overwritten and on the parity sector.

Figure 7:
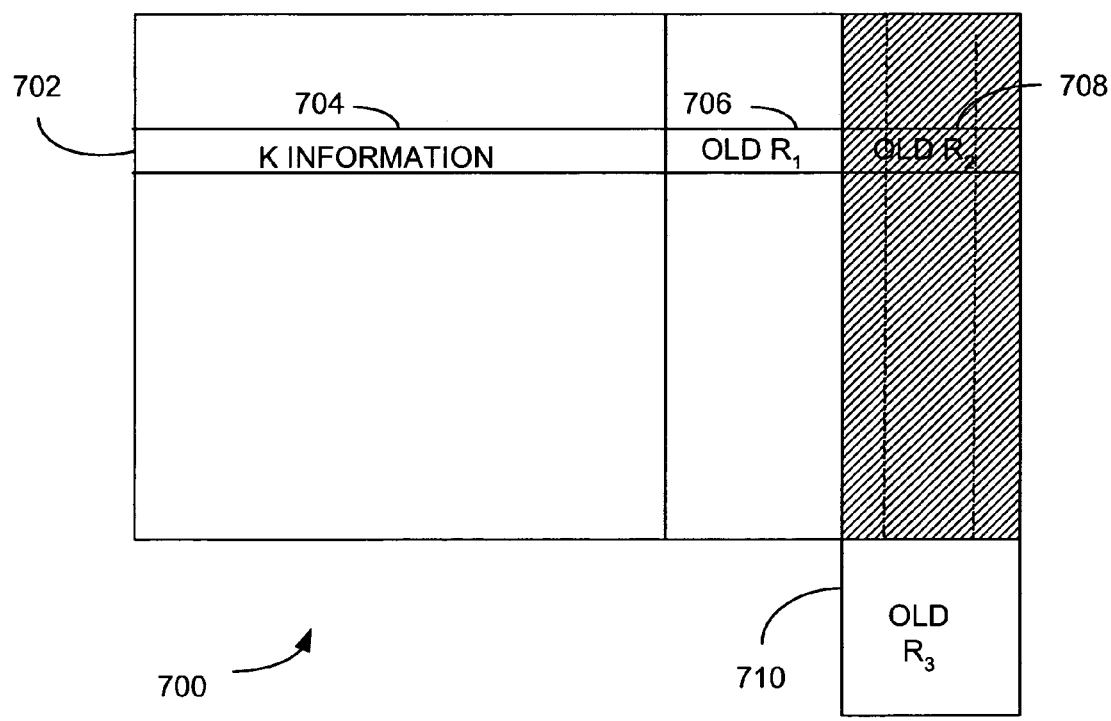
FIG. 7 is a diagram illustrating a cooperative block having a sector to be updated.

FIG. 7 is a diagram illustrating a cooperative block 700 having a sector 702 to be updated. The existing sector 702 has old information symbols 704, old $R_1$ parity symbols 706 and old $R_2$ hidden redundancy symbols 708. As the new information symbols are received by data formatter 320 for the sector to be overwritten, the ECC encoder in data formatter 320 generates new $R_1$ and $R_2$ parity symbols to form a new ECC codeword for sector 702. Since new $R_2$ parity symbols have been generated, the existing parity sector cooperative block 700 is outdated, as represented by the old $R_3$ shared redundancy symbols 710.

The new sector 702 is first written into the L2 cache along with both the $R_1$ and $R_2$ parity symbols. The $R_2$ parity symbols are not yet discarded. In one embodiment, the new sector 702 is stored in the L2 cache until the data storage device becomes idle. At this time, the read/modify/write operation can be performed without significantly impacting performance. In alternative embodiments, the read/modify/write operation can be performed at the time the new information symbols are received from the host system 101. In that case, the new sector with the new $R_1$ and $R_2$ parity symbols can be stored in local memory 312 during the read/modify/write operation.

Once the new sector is formed and the system is ready to perform a read/modify/write, the system reads the old sector 702 being overwritten from the disc such that $R_2$ parity symbols 708 of the old sector can be re-generated. It is not necessary to read the entire block if the system is only updating a sector. As mentioned above, there are two cases, the $R_1$ and $R_2$ can either be together as a single code or can be two separated ECC codes. In case 1, $R_1$ and $R_2$ are together as one single code, then the old $R_2$ is recovered as erasures of the horizontal codeword (i.e., the old sector 702). The EDC (shown in FIG. 3) of that codeword is used to check if the recovered data is valid. If the EDC is satisfied, then the old $R_2$ parity symbols are considered OK. Then the system uses the ECC encoder to generate the new $R_2$ parity symbols for the new sector.

Since a Reed Solomon code is a linear code, the system can just use the combination of old $R_2$ and new $R_2$ parity symbols to update the $R_3$ symbols in the parity sector without reading any other sectors. That means, since each $R_3$ symbol is just a linear combination of the vertically-aligned $R_2$ symbols (as shown in FIG. 2), it can be updated by knowing the old $R_2$ and the new $R_2$ without knowing the $R_2$ symbols of the other sectors.

In case 2, if the $R_1$ and $R_2$ parity symbols are generated using independent ECC codes, then the system can read the old sector and use the $R_1$ parity symbols to correct any error and use the EDC to see if the read is valid. If the EDC is satisfied, the system uses the data to generate the old $R_2$ for that sector. The new $R_2$ is generated by the encoder using the new data. The update of the $R_3$ parity symbols in the parity sector is same as in case 1.

The old sector 702 is then overwritten with the new information symbols and the new $R_1$ parity symbols. The new $R_2$ parity symbols for the new user data are discarded. The updated parity sector is also written to the disc as the last sector of the cooperative block.

3. Read Operations

Referring back to FIG. 5, data storage device 300 manages the cooperative block shown in FIG. 2 as a single unit. However, each individual sector within a cooperative block is readable as a stand-alone entity. Normally, the data storage device reads the desired user data sector or sectors and does not need to read the remaining sectors of the cooperative block or the parity sector for that block. The only time it is necessary to read the cooperative block as a group, including its parity sector, is when the shared redundancy is needed to correct sectors that are not correctable using the normal sector ECC (the $R_1$ parity symbols). In this situation, all the user data sectors and the parity sector of the cooperative block are read so that errors in the bad sector or sectors can be corrected.

During read back of a sector, if the sector has less than $R_1/2$ symbols errors, the data of that sector can be recovered using the normal sector-based ECC, which operates in an "on-the-fly" mode using the $R_1$ parity symbols. However if the number of errors in a sector, say sector Y, exceeds that limit, the shared redundancy mode will be activated as a read-retry step. In the read-retry step all sectors of the cooperative block are read and the hidden redundant $R_2$ parity symbols are regenerated sector by sector. As long as a sector has less than $R_1/2$ symbols errors, its $R_2$ redundant symbols can always be recovered directly as erasures.

The ($R_2 * R_3$) parity symbols of all vertical codewords 206 (in FIG. 2) are also read from the parity sector (shown in FIG. 4). This information can then be used to recover the $R_2$ redundant symbols of sector Y. To recreate the $R_2$ parity symbols of each sector in the cooperative block, the system reads that sector and generates its $R_2$ parity symbols. If the a sector is correctable by $R_1$ alone, the $R_2$ symbols of that sector can be recreated perfectly. If n sectors (Y1, Y2, . . . Yn) failed using $R_1$ alone, their $R_2$ are recovered by the $R_3$ parity symbols of the vertical codewords 206. As long as the value of n is smaller than the number of $R_3$ parity symbols in each vertical codeword, the $R_2$ parity symbols of those n sectors can be recreated as erasures by the vertical codewords. Note that the system first reads all sectors of the block and determines how many sectors need to recover their $R_2$ symbols as erasures. Then the system uses the $R_3$ symbols of vertical codewords to help recover those $R_2$ symbols.

With the $R_2$ parity symbols recovered, the horizontal code of sector Y will be able to correct a total of $(R_1+R_2)/2$ symbol errors.

Since the EDC symbols can be used to verify the correctness of each horizontal codeword, the erasure pointer for the vertical codewords will be set accurately. As long as only $R_3$ or less horizontal codewords require the extra $R_2$ parity symbols, the entire cooperative block can be recovered perfectly. Usually, a conservative measure can be taken to limit the number of failing horizontal words to somewhat less than $R_3$ to allow for some margin. This will keep the chance of miss-correction or catastrophic failure to a very low rate.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the data storage system while maintaining substantially the same functionality without departing from the scope of the present invention. In addition, although an embodiment described herein is directed to a data storage system for use in a disc drive it will be appreciated by those skilled in the art that the teachings of the present invention can be applied to any data storage system without departing from the scope of the present invention. Also, the write and read channels of the data storage system can each include a set of electronic components, coupled in a predetermined arrangement, for receiving and processing information. The electronic components and their corresponding functions can be implemented in hardware, software, firmware or a combination of any of these elements.

What is claimed is:

1. A method of storing data comprising:
    (a) generating a plurality of ECC codewords, which define a cooperative block, each ECC codeword comprising a plurality of information symbols and first and second sets of corresponding redundancy symbols;
    (b) generating shared redundancy symbols for the cooperative block based on a combination of the second sets of redundancy symbols from the plurality of ECC codewords;
    (c) forming a set of respective parity codewords for the cooperative block based on the shared redundancy symbols, wherein the second set of redundancy symbols for each ECC codeword in the cooperative block is derivable at least in part from the parity codewords; and
    (d) storing the cooperative block and the respective parity codewords, without the second set of redundancy symbols, on a storage medium.

2. The method of claim 1 wherein:
(a) comprises generating the plurality of ECC codewords successively, and as each ECC codeword is generated, storing in step (c) the plurality of information symbols and the corresponding first set of redundancy symbols for that ECC codeword on the storage medium;
(b) comprises collecting the second sets of redundancy symbols as each ECC codeword is generated and generating the shared redundancy symbols once all of the second sets of redundancy symbols are collected for the cooperative block; and
(c) further comprises storing the respective parity codewords once the shared redundancy symbols are generated in step (b) and the respective parity codewords are generated in step (c).

3. The method of claim 1 and further comprising:
(d) generating an updated ECC codeword for an old one of the plurality of ECC codewords that is stored on the storage medium and is to be overwritten, the updated ECC codeword comprising updated first and second sets of redundancy symbols;
(e) reading the old ECC codeword from the storage medium;
(f) regenerating the second set of redundancy symbols for the old ECC codeword;
(g) overwriting the old ECC codeword with the updated ECC codeword, including the updated first set of redundancy symbols, on the storage medium;
(h) reading the parity codewords of the cooperative block from the storage medium as old parity codewords;
(i) updating the old parity codewords for the cooperative block to produce an updated set of parity codewords based on a comparison of the second set of redundancy symbols for the old ECC codeword regenerated in (f) and the updated second set of redundancy symbols; and
(j) overwriting old the parity codewords with the updated parity codewords on the storage medium.

4. The method of claim 3 and further comprising:
(k) storing the updated ECC codeword, including the updated first and second sets of redundancy symbols, in a cache memory after step (d) and before steps (e) through (i); and
(l) reading the updated ECC codeword from the cache memory and performing step (g) with the updated ECC codeword read from the cache memory.

5. The method of claim 4 wherein the storage medium comprises a user data area and a separate buffer area and wherein the cooperative block is stored in the user data area and the cache memory is maintained in the buffer area.

6. The method of claim 4 wherein the storage medium comprises at least one magnetic storage disc.

7. The method of claim 4 wherein the cache memory is maintained externally to the storage medium on which the cooperative block is stored.

8. The method of claim 1 and further comprising:
(d) reading one of the ECC codewords from the storage medium and retrieving the plurality of information symbols from that ECC codeword, wherein the retrieval identifies at least one read error; and
(e) correcting the at least one read error using the respective first set of redundancy symbols from ECC codeword read in step (d).

9. The method of claim 8, wherein step (e) further comprises:
(e)(1) if the at least one read error is uncorrectable by using only the first set of redundancy symbols, performing steps (e)(2) to (e)(4);
(e)(2) reading the cooperative block from the storage medium, including the corresponding set of respective parity codewords;
(e)(3) regenerating the second set of redundancy symbols for the ECC codeword read in step (d) using the shared redundancy symbols for the set of respective parity codewords read in step (e)(2); and
(e)(4) attempting to correct the at least one error using both the first set of redundancy symbols read in step (d) and the second set of redundancy symbols regenerated in step (e)(3).

10. The method of claim 1 wherein step (b) comprises forming a plurality of vertical codewords, wherein:
each vertical codeword comprises a corresponding one of the second set of redundancy symbols from each of the plurality of ECC codewords in the cooperative block, which together define a plurality of parity information symbols;
each vertical codeword further comprises a third set of redundancy symbols that are based on the parity information symbols of that vertical codeword; and
the third sets of redundancy symbols from the plurality of vertical codewords together define the shared redundancy symbols for the cooperative block.

11. The method of claim 10 wherein the parity codeword comprises a plurality of information symbols and a plurality of further redundancy symbols and wherein step (c) comprises forming the respective parity codewords by using the shared redundancy symbols as the information symbols of the parity codewords and generating the further redundancy symbols based on those information symbols.

12. A data storage device comprising a write channel and at least one data storage medium, wherein the write channel is adapted to: (a) generate a plurality of ECC codewords, which define a cooperative block, each ECC codeword comprising a plurality of information symbols and first and second sets of corresponding redundancy symbols; (b) generate shared redundancy symbols for the cooperative block based on a combination of the second sets of redundancy symbols from the plurality of ECC codewords; (c) form a set of respective parity codewords for the cooperative block based on the shared redundancy symbols, wherein the second set of redundancy symbols for each ECC codeword in the cooperative block is derivable from the parity codewords; and (d) store the cooperative block and the respective parity codewords, without the second set of redundancy symbols, on the at least one data storage medium.

13. The data storage device of claim 12 and further comprising a local memory, wherein the write channel: generates the plurality of ECC codewords successively, and as each ECC codeword is generated, stores the plurality of information symbols and the corresponding first set of redundancy symbols for that ECC codeword on the at least one data storage medium; collects the second sets of redundancy symbols in the local memory as each ECC codeword is generated and generates the shared redundancy symbols once all of the second sets of redundancy symbols are collected for the cooperative block; and stores the respective parity codewords on the at least one data storage medium once the shared redundancy symbols and the respective parity codewords are generated.

14. The data storage device of claim 12 and further comprising a read channel, wherein:
the write channel generates an updated ECC codeword for an old one of the plurality of ECC codewords to be overwritten in the cooperative block on the at least one data storage medium, the updated ECC codeword comprising updated first and second sets of redundancy symbols;

the read channel reads the old ECC codeword from the at least one data storage medium without reading the other ECC codewords of the cooperative block, and reads the parity codewords of the cooperative block from the at least one data storage medium as a set of old parity codewords;

the write channel regenerates the second set of redundancy symbols for the old ECC codeword;

the write channel overwrites the old ECC codeword with the updated ECC codeword, including the updated first set of redundancy symbols, on the at least one data storage medium; and the write channel updates the old parity codewords for the cooperative block to produce a set of updated parity codewords based on a comparison of the second set of redundancy symbols for the old ECC codeword and the updated second set of redundancy symbols and overwrites the old parity codewords with the updated parity codewords, on the at least one data storage medium.

15. The data storage device of claim 14 wherein:

the write channel is adapted to store the updated ECC codeword, including the updated first and second sets of redundancy symbols, in a cache memory area on the at least one data storage medium after generating the updated ECC codeword and before reading the old ECC codeword, wherein the cache memory area is separate from a user data area in which the cooperative block is stored; and the read channel is adapted to read the updated ECC codeword from the cache memory and overwrite the old ECC codeword with the updated ECC codeword read from the cache memory.

16. The data storage device of claim 12 and further comprising a read channel, wherein the read channel reads one of the ECC codewords from the at least one data storage medium and retrieves the plurality of information symbols from that ECC codeword, wherein the retrieval identifies at least one read error, and wherein the read channel is adapted to correct the at least one read error using the respective first set of redundancy symbols of ECC codeword read from the at least one data storage medium.

17. The data storage device of claim 16, wherein the read channel is further adapted to perform the following steps if the at least one read error is uncorrectable by using only the first set of redundancy symbols:

(e)(1) read the cooperative block from the at least one data storage disc, including the corresponding set of parity codewords;

(e)(2) regenerate the second set of redundancy symbols for the ECC codeword read in (d) using the shared redundancy symbols for the parity codewords read in step (e)(1); and (e)(3) attempt to correct the at least one error using both the first set of redundancy symbols read in (d) and the second set of redundancy symbols regenerated in step (e)(2).

18. The data storage device of claim 12 wherein the write channel is adapted to generate the shared redundancy symbols for the cooperative block based on the combination of the second sets of redundancy symbols in (b) by forming a plurality of vertical codewords, wherein:

each vertical codeword comprises a corresponding one of the second set of redundancy symbols from each of the plurality of ECC codewords in the cooperative block, which together define a plurality of parity information symbols;

each vertical codeword further comprises a third set of redundancy symbols that are based on the parity information symbols of that vertical codeword; and the third sets of redundancy symbols from the plurality of vertical codewords together define the shared redundancy symbols for the cooperative block.

19. A data storage medium comprising:

a user data area comprising a plurality of data sectors, wherein the data sectors are grouped in cooperative blocks, each cooperative block comprising a set of the data sectors and a respective parity sector, each data sector comprising a plurality of information symbols and a first set of redundancy symbols, the parity sector comprising shared redundancy symbols from which a second set of hidden redundancy symbols, not stored in the user data area, can be recreated for each of the data sectors in the cooperative block; and a cache area separate from the user data area and storing an updated data sector for a corresponding one of the cooperative blocks, wherein the updated data sector comprises updated information symbols, an updated first set of redundancy symbols, and an updated second set of hidden redundancy symbols for the updated data sector.

20. The data storage medium of claim 19 wherein:

the shared redundancy symbols are arranged in sets of third redundancy symbols;

each set of third redundancy symbols represents redundancy symbols for a respective vertical codeword, which is formed by one of the hidden redundancy symbols in the second set of each of the plurality of data sectors in the cooperative block.

* * * * *